(12) United States Patent
Kunemund

(10) Patent No.: US 7,248,506 B2
(45) Date of Patent: Jul. 24, 2007

(54) CIRCUIT ARRANGEMENT HAVING SECURITY AND POWER SAVING MODES

(75) Inventor: Thomas Kunemund, Munich (DE)

(73) Assignee: Infineon Technologies AG, Munich (DE)

( * ) Notice: Subject to any disclaimer, the term of this patent is extended or adjusted under 35 U.S.C. 154(b) by 88 days.

(21) Appl. No.: 11/264,703

(22) Filed: Oct. 31, 2005

(65) Prior Publication Data

US 2006/0098476 A1 May 11, 2006

(30) Foreign Application Priority Data

Nov. 3, 2004 (DE) .................. 10 2004 053 127
Jan. 12, 2005 (DE) .................. 10 2005 001 484

(51) Int. Cl.
  *G11C 7/00* (2006.01)
  *G11C 5/14* (2006.01)
(52) U.S. Cl. .................. 365/189.05; 365/226; 365/227
(58) Field of Classification Search ........... 365/189.05, 365/226; 265/227
See application file for complete search history.

(56) References Cited

U.S. PATENT DOCUMENTS

2005/0241005 A1* 10/2005 Kunemund .................. 726/36

FOREIGN PATENT DOCUMENTS

| DE | 196 31 911 A1 | 1/1998 |
|---|---|---|
| DE | 101 36 335 A1 | 2/2003 |
| DE | 102 02 726 A1 | 8/2003 |
| DE | 103 24 049 A1 | 12/2004 |
| WO | WO-03/102786 A2 | 12/2003 |

* cited by examiner

*Primary Examiner*—Son Dinh
(74) *Attorney, Agent, or Firm*—Dickstein, Shapiro, LLP.

(57) ABSTRACT

Circuit arrangement having complementary data input nodes for reception of a dual rail data signal and complementary data output nodes for outputting a dual rail data signal. A connection switch is connected to complementary data nodes by means of which the complementary data nodes can be connected to one another with a low resistance, a control unit is provided for generating a first control signal for the connection switch, and the circuit arrangement is designed to be operated in two operating modes, in which case in a power saving mode, the connection switch is switched by the control unit to have a high resistance, and in a security node, the connection switch is switched by the control unit to have a low resistance when the potential at the complementary data nodes is intended to be equalized.

33 Claims, 12 Drawing Sheets

CIRCUIT ARRANGEMENT HAVING SECURITY AND POWER SAVING MODES

CROSS-REFERENCE TO RELATED APPLICATION

This application claims priority to German Patent Application Serial No. 102004053127.7 filed Nov. 3, 2004, and German Patent Application Serial No. 102005001484.4 filed Jan. 12, 2005, both of which are incorporated herein by reference in their entireties.

FIELD OF THE INVENTION

The invention relates to a circuit arrangement having complementary data input nodes for reception of a dual rail data signal and complementary data output nodes for outputting a dual rail data signal. The invention also relates to a method for operation of a dual rail circuit arrangement.

BACKGROUND OF THE INVENTION

So-called dual rail circuit technology, which is also referred to as complementary circuit technology, relates to a circuit arrangement design whose security aspects have been improved, in particular for data processing apparatuses. Circuits are normally designed using so-called "signal rail circuit technology". In this case, switching networks are formed microelectronically such that each bit of the information to be processed is represented physically by one and only one electrical node. Switching networks such as these are relatively insecure when subjected to so-called differential current profile analysis, which is often used when unauthorized third parties attempt to access secret information. Differential current profile analysis, which is also referred to as differential power analysis (DPA), is one of the most important methods for attacking, for example, smart cards for security applications. Smart card current profiles measured by statistical methods and their charge integrals calculated over one or more clock cycles are evaluated for a given program or a given algorithm, in which case conclusions about the information to be protected can be drawn from the correlation between the systematic data variation and the respective charge integral, for a large number of programmed versions.

One possible way to make DPA attacks at least considerably more difficult is to interchange or to transmit data between subsystems of an integrated circuit only in an encryption form, as far as possible. One crypto system which is suitable for this purpose is so-called one-time pad encryption. Keys obtained as random sequences are linked bit-by-bit with texts to be transmitted, via an XOR gate. An XOR gate is once again used for deencryption. For the one-time pad crypto system, it is important that each key sequence is used only once for encryption and deencryption, because information relating to plain texts can otherwise be obtained by statistical methods.

This "encrypted calculation" using the single rail circuit technique requires a very large amount of circuit complexity and thus a large surface area, however, and the power consumption is in consequence increased. The dual rail circuit technique is used in order to avoid the need for encryption. From what has been stated above with regard to differential current profile analysis, it can be stated that the circuit components in an integrated circuit should ideally be designed, in order to resist DPA attacks, in such a way that they always produce the same current profile irrespective of the data to be processed. However, this is not reliably the case for the single rail implementation, because the charge integral associated with the time profile of the states of a circuit is a function of those nodes and/or electrical capacitances whose electrical charge levels are changed, that is to say it is highly dependent on the changes in the data to be processed over time.

In contrast to conventional single rail circuit technology, each bit is represented by two nodes k and kq in dual rail circuit technology, with a transmitted bit having a valid logical value when k corresponds to the true logical value b, and kq corresponds to the negated value bn=not(b).

Thus, when the aim is to transmit the value b=1, then this is done by means of a "1" in the node k. At the same time, however, the value "0" is transmitted at the node kq, so that, overall, both a "1" and a "0" are thus transmitted. When the aim is to transmit the value b=0, the value "1" is transmitted at the same time at the node kq. A "1" and a "0" are thus transmitted in both cases. Assuming that the nodes k and kq are physically equivalent, it is no longer possible to use differential current profile analysis to determine whether a "1" or a "0" has been transmitted as the data item. However, this is true only when a signal change actually takes place for each transmitted data item, that is to say the information "1" and the information "0" alternate. If a plurality of identical data items are transmitted successively, the characteristics with regard to the capability for attacks by differential current profile analysis deteriorate.

The desired invariance of the charge integrals is now achieved by inserting a so-called precharge state between two states with valid logical values (b, bn)=(1,0) or (0,1) for which both k and kq are charged to the same electrical potential, that is to say they assume logically invalid values (1,1) or (0,0). A state sequence for the precharge state (1,1) could thus appear as follows:

(1,1)→(0,1)→(1,1)→(1,0)→(1,1)→(1,0)→(1,1)→(0,1)→ . . .

For any such character sequence, it can be stated that the charge on one and only one node is changed from "1" to "0" for each transition (1,1)→(b, bn) and that the charge on one and only one node is changed from "0" to "1" for all (b, bn)→(1,1) irrespective of the logic valid value b of the state bit in question. An analogous situation applies to the state sequences with the precharge state (0,0).

This means that the charge integrals which correspond to these state sequences are independent of the sequence (b, bn) of the logically valid values, provided that care is taken to ensure that the nodes k and kq have the same electrical capacitances. The current profile of a data path implemented in this way thus does not depend on time variations in the data to be processed, and is therefore resistant to differential current profile analysis.

One example of a dual rail implementation of a circuit component is known from DE 102 02 726 A1. The integrated circuit proposed there is a register in a data path. The proposed circuit arrangement is designed consistently using dual rail technology, and thus forms a charge-neutral register.

One problem in designing circuit components using dual rail circuit technology is that the power consumption is considerably greater.

SUMMARY OF THE INVENTION

A circuit arrangement having complementary data input nodes for reception of a dual rail data signal, and complementary data output nodes for outputting a dual rail data signal. A connection switch is connected to complementary data nodes by means of which the complementary data nodes can be connected to one another with a low resistance. A control unit is provided for generating a first control signal for the connection switch. The circuit arrangement is designed to be operated in two operating modes. In a power saving mode, the connection switch is switched by the control unit to have a high resistance. In a security node, the connection switch is switched by the control unit to have a low resistance when the potential at the complementary data nodes is intended to be equalized.

BRIEF DESCRIPTION OF THE DRAWINGS

The invention will be explained in more detail in the following text with reference to exemplary embodiments. In the figures.

DETAILED DESCRIPTION OF PREFERRED EMBODIMENTS OF THE INVENTION

Figure 1:
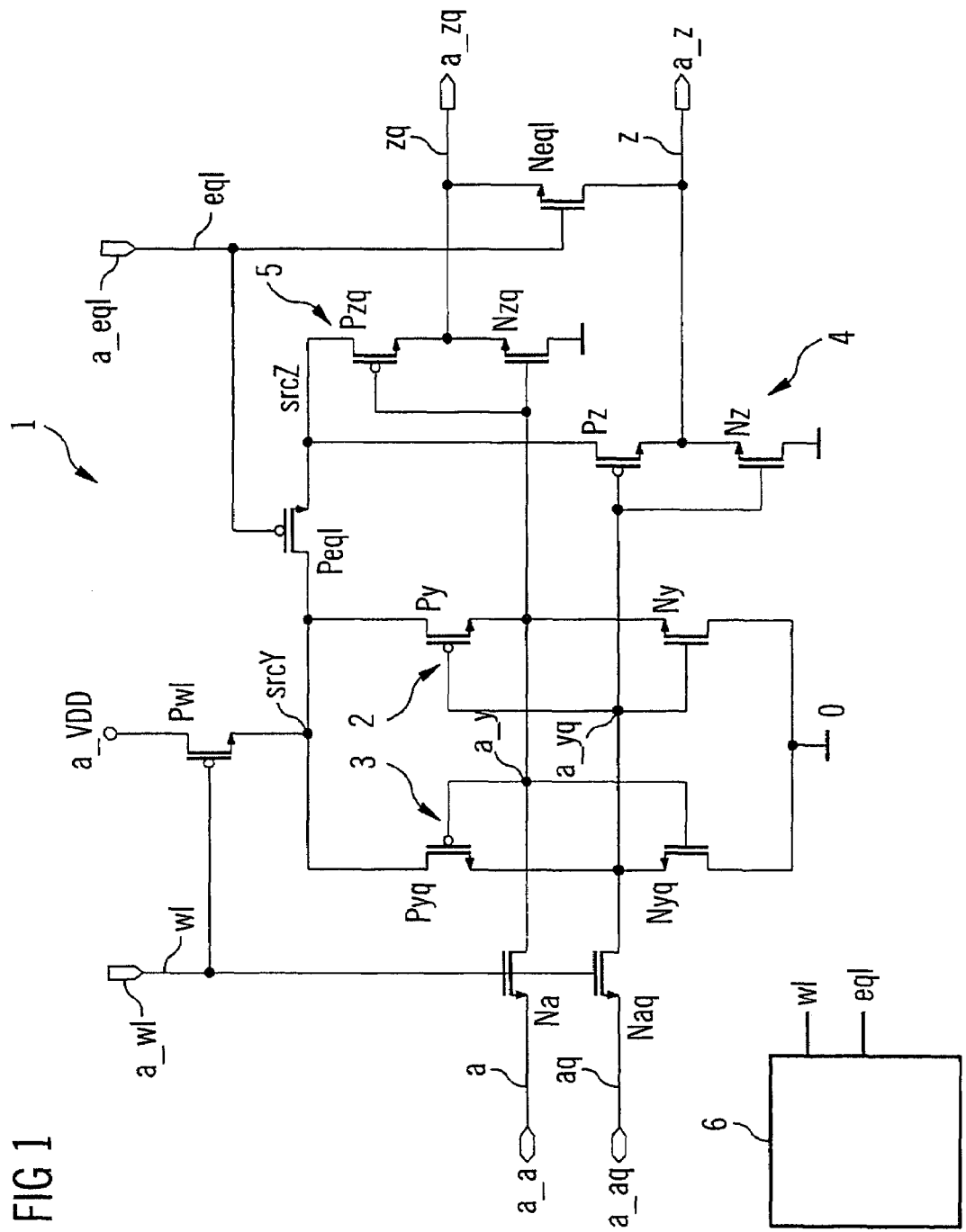
FIG. 1 shows a first exemplary embodiment of a circuit arrangement according to the invention.

One object of the invention is to specify a data processing apparatus which on the one hand is secure against DPA attacks, while on the other hand it consumes little power. A further object is to specify a method by means of which a dual rail circuit component can be operated efficiently in terms of power consumption.

This object is achieved by a circuit arrangement of the type mentioned initially which is distinguished in that a controllable connection switch is connected to complementary data nodes by means of which the complementary data nodes can be connected to one another with a low resistance, a control unit is provided for generating a first control signal for the connection switch, and the circuit arrangement is designed to be operated in two operating modes, in which case in a power saving mode, the connection switch is switched by the control unit to have a high resistance, and in a security node, the connection switch is switched by the control unit to have a low resistance when the potential at the complementary data nodes is intended to be matched.

The object is likewise achieved by a method for operation of a dual rail circuit component, which is distinguished in that the dual rail circuit component can be operated alternatively in a security mode or in a power saving mode, with operation in the security mode involving two complementary data nodes being connected when the potential at the data nodes is intended to be matched in the security mode.

Both the circuit arrangement according to the invention and the method according to the invention make use of the fact that valid dual rail signals lead to a logic "1" on one line, and to a logic "0" on the complementary line. If two complementary data nodes are connected to one another, the potential at the data node which was previously "1" is drawn to the reference ground potential, which corresponds to a logic "0". A single controllable switch, preferably a transistor, is required for connection of the two data nodes, so that the design of the circuit according to the invention is very simple. A control signal is required in order to drive the controllable switch, and can be obtained from a control unit which is required in any case in order to produce other control signals. Little complexity is therefore required for this purpose.

In one advantageous refinement of a circuit arrangement according to the invention, the data nodes to which the connection switch is connected are arranged on the output side in the data flow direction.

In one preferred refinement, the circuit arrangement has a memory element which is also referred to as a latch. Latches are widely used in electrical circuit arrangements in order to temporarily store signals. In order to control the processes of writing to the latch, it is advantageous to arrange so-called pass gate transistors upstream of the memory element, which are driven by a second control signal that is generated by the control unit, in order to disconnect data inputs of the memory element from data inputs of the circuit arrangement. The pass gate transistors are switched to have a low resistance in order to write a data item to the latch. Once the memory element has assumed its state corresponding to the input data item, the pass gate transistors can be switched to a high resistance again. The memory element thus retains the data item written to it.

In one advantageous refinement, the memory element is formed by two memory inverters. Output inverters and input inverters can be provided in order to decouple the memory element from upstream or downstream circuit arrangements. In order to prevent parallel currents, it is advantageous to connect the connections of the output and input inverters on the supply voltage side to an isolating transistor so that it is possible to isolate the inverters from a node that is at a supply voltage when the complementary data nodes are connected by means of the connection switch.

In another advantageous refinement of a circuit arrangement according to the invention, with a latch, this circuit arrangement is designed using pass transistor logic, that is to say the circuit input can be connected directly to the output. An alternative decoupling circuit is used for this purpose, and is arranged upstream of the memory element, in the data flow direction. In this case, as in the advantageous embodiment mentioned above, a first and a second pass gate transistor are provided in order to disconnect the data inputs of the memory element from complementary data nodes which can be connected by means of a controllable switch according to the invention. Furthermore, a third and a fourth pass gate transistor are provided, are arranged upstream of the first and the second pass gate transistor in the data flow direction, and are used to disconnect the complementary data nodes from these associated data inputs in the circuit arrangement. Furthermore, two transistors are provided, by means of which the two complementary data nodes can each be connected to a reference ground potential node. The gate connections of these transistors are each connected to the input node which is associated with the other data node. A circuit arrangement such as this is particularly advantageous because, apart from the transistors for the memory inverters, they can be implemented using only n-channel transistors, thus resulting in a very space-saving circuit arrangement, overall.

The dual rail circuit can be developed by generating a potential balance state (so-called equalized state) as the precharge state rather than by using a "1" or "0" corresponding to a high or low signal level, in which potential balance state the potential at both complementary nodes is the same and in this case is at an intermediate range between a high signal level and a low signal level.

The operating behavior of dual rail circuits in which a high signal level or a low signal level is used as the precharge potential is not always optimal. This is particularly true when so-called pass gate logic is also used. In this case, one circuit input is connected to one circuit output by means of a switch, with logic functions being implemented. Instead of reaching the full high signal level downstream from the transistor in the signal flow direction, the voltage rises only to about $U_{on}$-VTN, where $U_{on}$ is the voltage of the signal at the circuit input, and VTN is the threshold voltage of the transistor that is used. For this reason, signal refreshing is often required at the output of the circuit arrangement, in order to output a logic "1" at the full supply voltage level. A collision situation can occur at the nodes that are involved when a signal change occurs. A node which, by way of example, was initially at the high signal level must be discharged to the low signal level. This is generally done by means of one or more series-connected n-channel transistors.

At the same time, however, a circuit is provided in order to draw a node potential to the full supply voltage potential, in order to refresh the signal. These transistors operate in opposite senses when a signal change occurs, resulting in parallel currents flowing. These result in a significant increase in the circuit power consumption. Another problem from the functional point of view is that the transistors can switch in an uncontrolled manner, particularly when the discharge path has a plurality of series-connected transistors. This can lead to switching delays, and in the worst case the circuit arrangement will malfunction completely.

The power consumption can be reduced while at the same time ensuring a reliable operating capability by producing the potential balance state, as mentioned above, in the precharge phase.

A means of generation of a potential balance state must be provided for this purpose. A plurality of effects are in fact achieved by matching the signal levels such that they are in the said intermediate range. The potential at the data output node is in a range in which the switching thresholds of the transistors for signal refreshing are also located. A small reduction in the potential at one of the data output nodes can result in a change in the switching state, so that there is no longer any attempt to draw the voltage to an upper supply voltage potential. The collision situation described initially between a discharging transistor and a voltage refreshing transistor no longer occurs, or occurs only briefly. Parallel currents are avoided in this way, so that this results in effective power saving. At the same time this prevents transistors from switching unreliably, thus, overall, also improving the functionality of the circuit. If the supply voltage is 1.5 V, the intermediate range is preferably between 0.9 V and 1.1 V. The upper limit is governed by the supply voltage minus the threshold voltage of the transistors used, for example of 0.5 V. The intermediate range for a supply voltage of 1.2 V is preferably between 0.6 V and 0.8 V.

An additional advantage is obtained from the fact that the transistors can switch considerably more quickly, since less charge need be transported. This results in a data processing speed advantage.

The potential balance is advantageously achieved by a connection transistor which is arranged between the complementary data output nodes and can be driven by a control signal. If the connection transistor is driven appropriately, the complementary data output nodes are connected with a low resistance in the potential balance stage.

Two cross-coupled p-channel transistors are preferably provided in order to set the potential of the complementary data output nodes in said intermediate range, and their source connections are each connected to a supply voltage connection which is at an upper supply voltage potential, while the drain connections are in each case connected to one of the complementary data output nodes, and their gate connections are each connected to the drain connection of the other transistor, in order to constitute the cross-coupling. This on the one hand advantageously means that the potential at the data output nodes is fixed in the intermediate range in the potential balance state, while at the same time ensuring, in an assessment phase, that a high signal is "refreshed", that is to say it is drawn to the full supply voltage potential.

Another advantageous development of the invention is achieved in that signal processing units, such as XOR gates or multiplexers, can likewise be driven by dual rail control signals. In one advantageous embodiment, optional precharge phases can be inserted in the control signals. In this case, it is possible to operate the extended part of the circuit differently in the security mode and in the power saving mode, so that the entire circuit can be operated in the operating mode which is referred to as the security mode. The precharge phases are in this case coincident in time with the potential balance state, so that this results in the same functionality externally, but the current drawn by the circuit arrangement is independent of the data being processed. If a multiplexer is used, it is advantageous for the control signals which are used there, that is to say the selection signals, to be at the same signal level during the potential balance state. This is admittedly an invalid control signal, since this would result in all of the data sources being selected, but this is irrelevant since an invalid signal is outputted in any case at the output, because of the low-resistance connection of the data output nodes.

In contrast, in the operating mode which is referred to as the power saving mode, there is no need to provide precharge phases for the control signals. This is, however, necessary when the function of the circuit arrangement is also determined in this way. For example, this is the situation when a signal processing unit which is connected upstream of the data output nodes is designed such that a low-resistance connection can likewise be established between the data output nodes, instead of using a connection transistor as is proposed in one advantageous refinement of the invention above. In this case, it may be necessary to use a precharge signal to drive this signal processing unit, in order to generate the potential balance state, in which the low-resistance connection is required to match the potentials at the complementary data output nodes.

FIG. 1 shows a first refinement of a circuit arrangement according to the invention. This is an apparatus for storage of one bit, a so-called latch. A data item (a,aq) to be stored is applied to an input a_a, a_aq as a dual rail signal. A stored data item can be read at an output a_z, a_zq, and is in this case likewise a dual rail signal. The actual memory is formed by two latch inverters 2 and 3, which are formed using transistors Pyq, Nyq and Py, Ny, respectively. The nodes via which the latch can be accessed are annotated a_y and a_yq. The latch inverters are preceded by two pass gate transistors Na and Naq, via which write access to the memory inverters 2 and 3 can be controlled. A control signal w1 is provided for controlling the latch, and is applied to a control input a_w1. When the control signal w1 is at a high supply potential, for example the supply voltage VDD, this corresponds to a logic "1". When the control signal w1 is at a reference ground potential, this thus corresponds to a logic "0". For w1=1, the pass gate transistors Na and Naq are switched on, and a data item which is applied to the data input a_a, a_aq is transferred to the actual memory transistors. When w1=0, a previously written data item is maintained.

The processes for reading and writing a data item will be explained in more detail in the following text. In order to write a data item, a valid data item is first of all applied to the inputs a_a, a_aq. In the case of dual rail logic, a valid data item means that the signal levels of the dual rail signal are (a,aq)=(0,1) or (1,0). When the control signal w1 changes to "1", the n-channel transistors Na and Naq which connect the input nodes a_a and a_aq to the nodes a_y, a_yq are switched on. The nodes a_y, a_yq then assume the same potential as that of the inputs a_a, a_aq.

In order to explain the circuit arrangement shown in FIG. 1, it is assumed that (a,aq)=(1,0) and that w1=1, so that the data nodes a_y, a_yq are connected to data input nodes a_a, a_aq. The p-channel transistor Pyq is switched off in these signal states. The n-channel transistor Nyq is in contrast switched on, so that the node a_yq is connected to the reference ground potential 0. The p-channel transistor Py is switched on, so that the node a_y is connected to the node srcY. The transistor Ny is switched off. As long as w1=1, the p-channel transistor Pw1 is switched off, so that the node srcY is temporarily at a floating potential. As soon as the control signal w1 changes to "0", the transistors Na and Naq switch off, and the potential of the nodes a_y, a_yq becomes independent of the input signal (a,aq). At the same time, the transistor Pw1 switches on, so that the node srcY is connected to the supply potential at the node a_VDD and is thus at a logic "1". Since the transistor Py is switched on, the node a_y is thus likewise connected to a_VDD, and maintains the logic "1", as was predetermined by the data input signal a_aq. The transistor Pw1 was used to prevent parallel currents during the writing process. Since the transistor Py is switched on, the potential of the node a_y is maintained, and since the transistor Nyq is switched on, the potential of the node a_yq is maintained, thus providing latch-internal feedback. The writing process is thus completed, and the stored data is maintained in the latch.

Two output inverters 4 and 5 are provided on the output side, and are formed by transistors Pzq, Nzq, Pz and Nz. These have a dual function. On the one hand, they are used to decouple the latch that is shown from downstream circuit components, thus ensuring that the values stored in the latch are dependent only on the input signal (a,aq). On the other hand, they represent a driver circuit, so that the latch is not influenced by the current drawn by downstream circuit components. The potential at the node a_y is outputted in an inverted form at the output node a_zq, while the potential at the node a_yq is generated in inverted form at the output node a_z. Data can be transmitted only in this direction while, in contrast, the potential at the output nodes a_z, a_zq cannot be transferred to the nodes a_y, a_yq.

A controllable connection switch, specifically a switching transistor Neq1, is provided in order to implement the various operating modes that are intended according to the invention, and this is also referred to in the following text as a connection transistor, and is driven by an additional control input a_eq1. A control signal eq1 which is applied to the control input a_eq1 is used to control the switchable discharging of the two output nodes a_z, a_zq by means of the connection transistor Neq1. When eq1=1, the output nodes a_z and a_zq are conductively connected to one another via the connection transistor, that is to say the n-channel transistor Neq1. When eq1=0, the n-channel transistor Neq1 has a high resistance, so that the nodes a_z, a_zq do not influence one another. At the same time, the p-channel transistor Peq1 is switched on, so that the output inverters are operated in the normal mode, and the potentials at the output nodes a_z, a_zq are governed by the potentials at the nodes a_y, a_yq.

When eq1=1, the transistor Peq1 has a high resistance, in order to prevent parallel currents. At the same time, the n-channel transistor Neq1 has a low resistance, so that the nodes a_z and a_zq are connected to one another with a low resistance. Since either the potential at the node a_y or that of the node a_yq is "1", one of the transistors Nz, Nzq has a low resistance and connects the respective node a_z or a_zq to the reference ground potential. Since the connection to the transistor Neq1 is conductive, the other output node is also drawn to the reference ground potential. Since, as stated above, the transistor Peq1 is switched off, this prevents any current from being able to flow via the transistors Pw1, Peq1 and Pzq or Pz, that is to say this prevents a short circuit.

The potential at the output nodes a_z and a_zq is thus in each case 0. In conjunction with the connection transistor Neq1, the control signal eq1 thus allows the generation of the so-called precharge state. This switchable charge neutrality means that the circuit arrangement is designed to be operated in two operating modes, specifically in a power saving mode and in a security mode. In the power saving mode, the connection switch which is formed by the transistor Neq1 permanently has a high resistance. This means that no precharge phases are produced. Only the valid dual rail signals (0,1) and (1,0) occur on the output side. Since the output nodes a_z and a_zq have their charge levels changed only when this necessary for the transmission of data, relatively little power is consumed. The circuit arrangement according to the invention can, however, also be operated in a security mode. In the security mode, a precharge phase is inserted between two data items to be outputted, by setting the signal eq1 to "1", as a result of which the switch Peq1 is opened, and the switch Neq1 is closed, in order to connect the data output nodes to one another. The precharge phase also results in one of the output nodes being discharged, even though this would not be necessary for the transmission of a data item. This is associated with a high power consumption, but on the other hand increases the security of the circuit arrangement, since a current profile produced by the circuit is independent of the data being processed.

The control signal eq1 for the connection transistor Neq1 is produced by a control unit 6, in the same way as the control signal w1, as is shown in the illustration in the form of a schematic block in the illustration in FIG. 1.

It should be noted that it would also be possible to produce the potentials (1,1) at the nodes a_z, a_zq as a precharge phase. The output circuitry would have to be appropriately modified in order to ensure that one of the output nodes a_z, a_zq is always connected to the supply potential, so that both nodes are drawn to the potential "1" by connection of the output nodes a_z, a_zq.

It is, of course, also possible to use p-channel transistors instead of n-channel transistors, provided that the logic of the control signals is appropriately adapted. Adaptations such as these are within the scope of a person skilled in the art.

Figure 2:
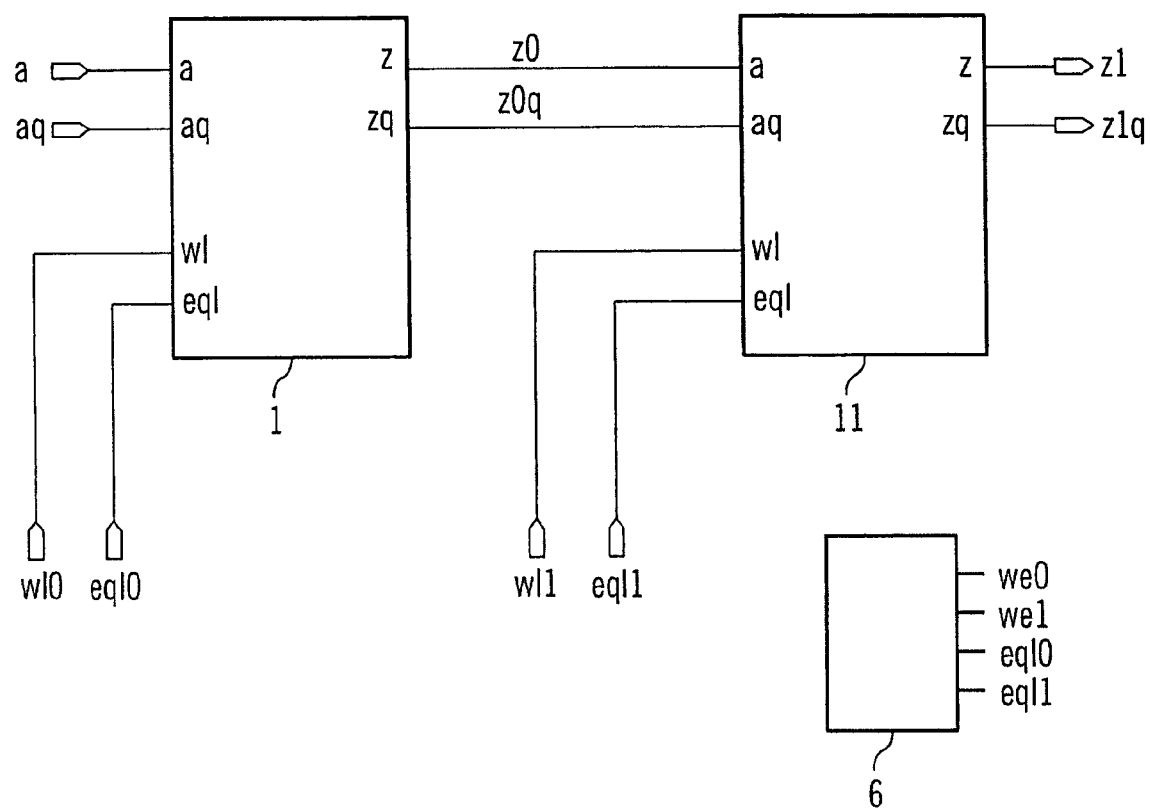
FIG. 2 shows an arrangement of two circuit arrangements as shown in FIG. 1.
Figure 3:
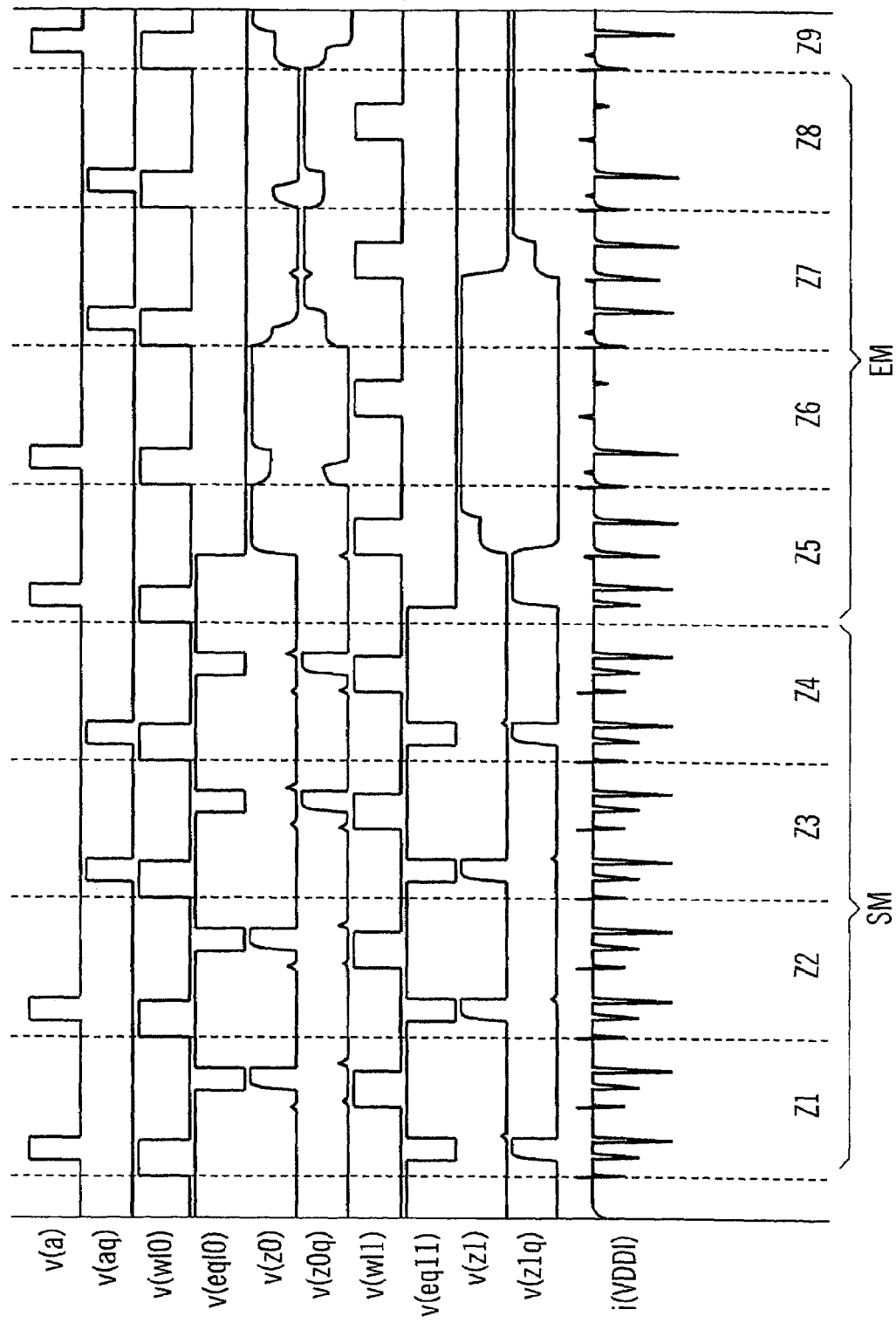
FIG. 3 shows a diagram illustrating time signal waveforms of signals in the circuit arrangement shown in FIG. 2.

FIG. 2 shows, schematically, two series-connected latch cells, as are illustrated in FIG. 1. FIG. 3 shows the time waveform of the control signals w10, eq10, w11 and eq11, of the data signals (a,aq), (z0,z0$q$) and (z1,z1$q$) as well as the profile of the current i(VDD), which is produced from the supply voltage VDD, for the circuit shown in FIG. 2. In this case, the time axis is subdivided into cycles, with the circuit being operated in the security mode SM during the cycles Z1, Z2, Z3 and Z4, and being operated in the power saving mode EM in the cycles Z5, Z6, Z7 and Z8. A data item (a,aq) is first of all written to the first latch 1 in each of the cycles when w10=1 transferred from there via (z0,z0$q$) to the second latch cell 11 when w11=1. The operations Z1, Z2, Z3 and Z4 are carried out in the security mode SM. The control signals eq10 and eq11 are thus used to set the data outputs (z0,z0$q$) and (z1,z1$q$) of the latch memories to (0,0) at regular intervals. As can be seen from the curve for i(VDD), all the cycles have the same current profile in the security mode. In consequence, determined charge integrals, that is to say the total amount of charge which has flowed into the circuit, is also identical.

After switching to the power saving mode EM in the cycle Z5, eq10 and eq11 remain static at 0, so that the state (0,0) is no longer passed through for (z0,z0$q$) and (z1,z1$q$). As is evident from the curve i(VDD), virtually no current flows anymore when the data items do not change. The average power consumption is considerably decreased. However, it is possible to identify from the current profile whether the processed data has or has not changed.

Figure 4:
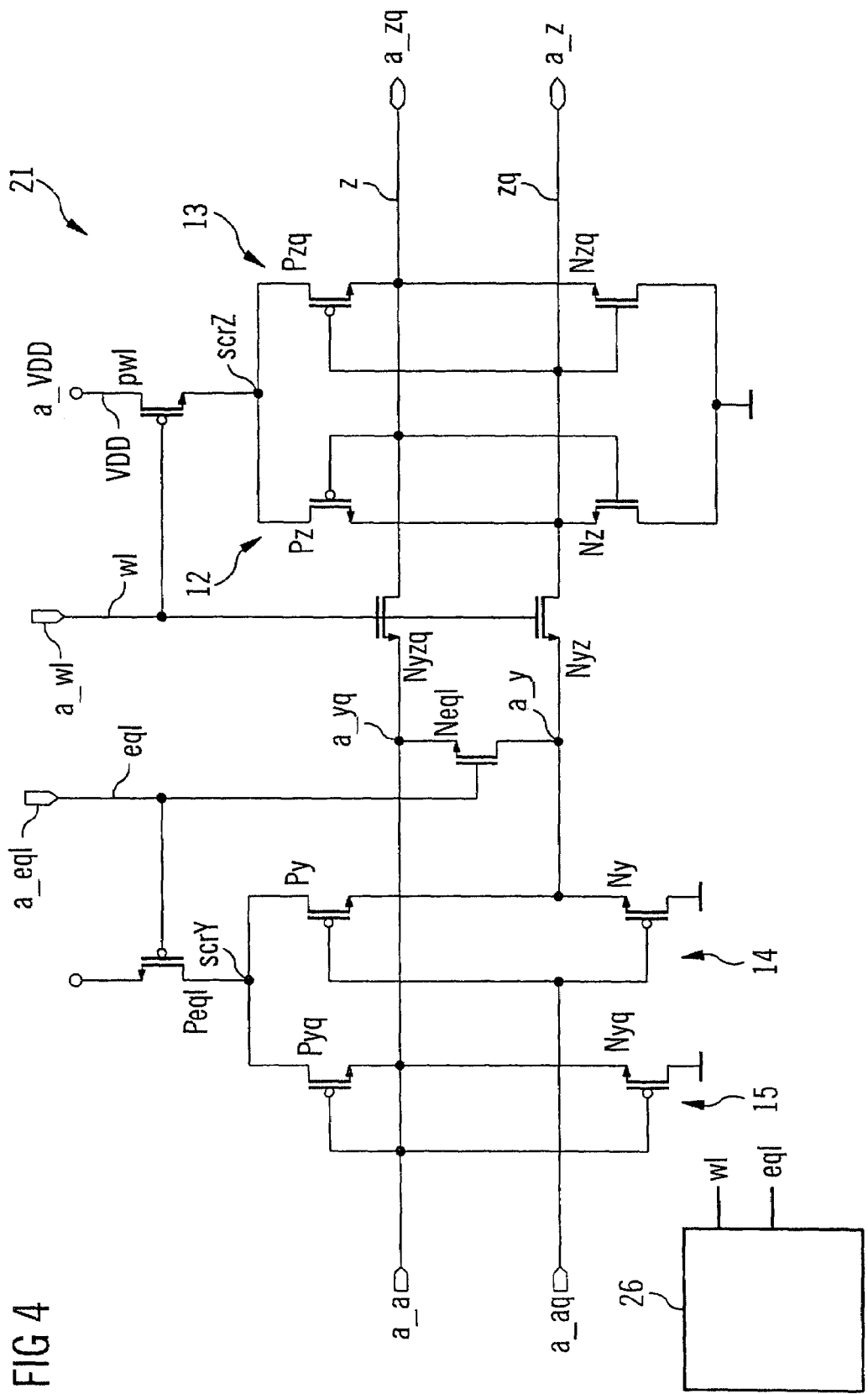
FIG. 4 shows a second exemplary embodiment of a circuit arrangement according to the invention.

FIG. 4 shows a second exemplary embodiment of a circuit arrangement according to the invention. This is likewise an apparatus for storage of one bit, that is to say a latch. In contrast to the circuit arrangement shown in FIG. 1, input inverters 14 and 15 are provided rather than output inverters. As in the case of the circuit arrangement shown in FIG. 1 as well, a dual rail signal (a,aq) which is applied to complementary data input nodes a_a, a_aq is transferred to the latch inverters 12 and 13 when w1=1 at the control input a_w1, with the signal (a,aq) first of all being inverted by the input inverters 14 and 15 in the embodiment shown in FIG. 4. For this purpose, as in the case of the circuit arrangement shown in FIG. 1 as well, pass gate transistors Nyz and Nyzq are provided upstream of the latch inverters 12 and 13. When w1=0, a previously written data item is maintained in the latch inverters 12 and 13.

In contrast to the circuit shown in FIG. 1, a stored data item is represented directly by the potentials at the outputs a_z, a_zq independently of the selected operating mode. The p-channel transistor Pw1 is switched off when w1=1, thus disconnects a_z, a_zq from the supply potential VDD at the input a_VDD, thus preventing parallel currents from flowing through the two latch inverters 12 and 13, while the latch-internal feedback is activated when w1=0, as has been described with reference to FIG. 1.

The control signal eq1, which is applied to the control input a_eq1 is used for switchable discharging of the two nodes y, yq which are located between the input inverters 14 and 15 and the pass gate transistors Nyz, Nyzq, with the control signal w1, which is generated by a control unit 26, being applied to the latter. When eq1=1, a_y and a_yq are conductively connected to one another via the controllable connection switch which is formed by the n-channel transistor Neq1. One of the nodes a_y, a_yq is connected to the reference ground potentials via the input inverters 14 and 15. Both nodes a_y, a_yq are drawn to the reference ground potential because of the conductive connection via the connection transistor Neq1.

The circuit elements used are thus arranged in a similar manner to that in the circuit arrangement shown in FIG. 1, but in a different sequence. While, in the case of the circuit arrangement shown in FIG. 1, a precharge phase was produced independently of the data item stored in the latch, the precharge phase is stored on the input side in the circuit arrangement shown in FIG. 4. The invalid signal state (0,0) is written to the latch, and is thus also produced at the output.

During the matching of the potential at the nodes a_y, a_yq by a connection transistor Neq1, the nodes a_y, a_yq are disconnected from the input nodes a_a and a_aq by the input inverters 14 and 15, thus preventing parallel currents from flowing via circuit components connected on the input side.

Figure 5:
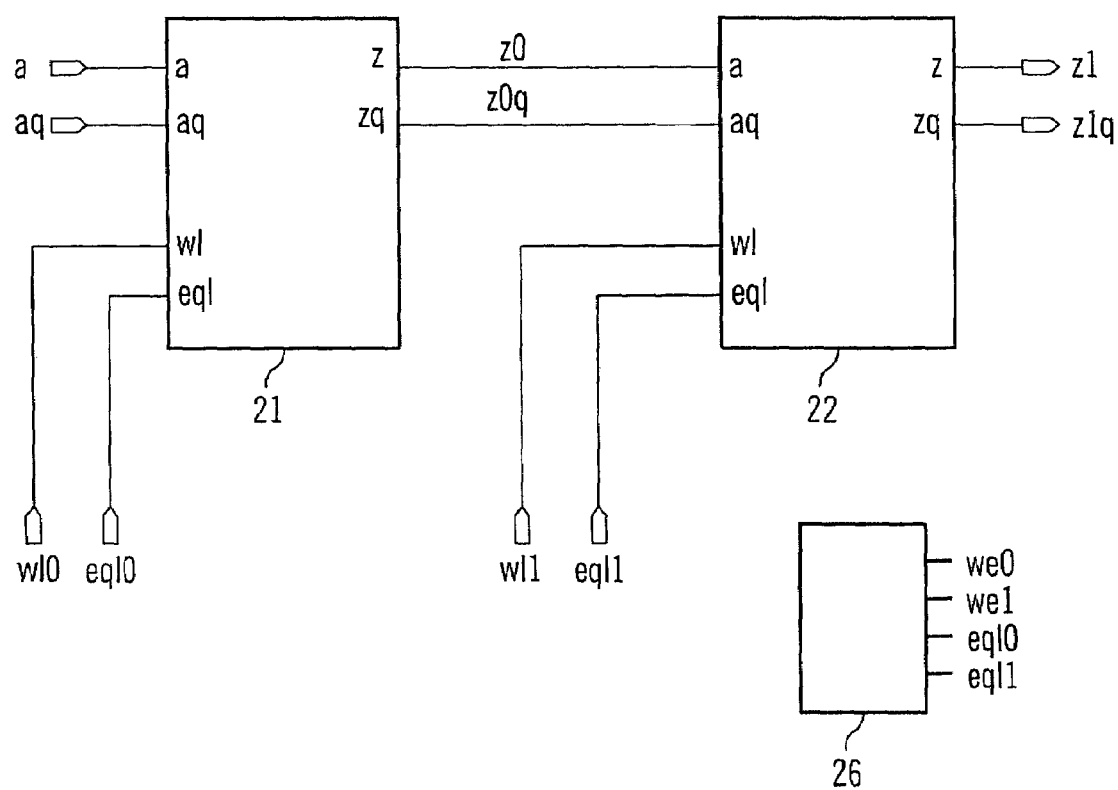
FIG. 5 shows an arrangement of two circuit arrangements as shown in FIG. 4.
Figure 6:
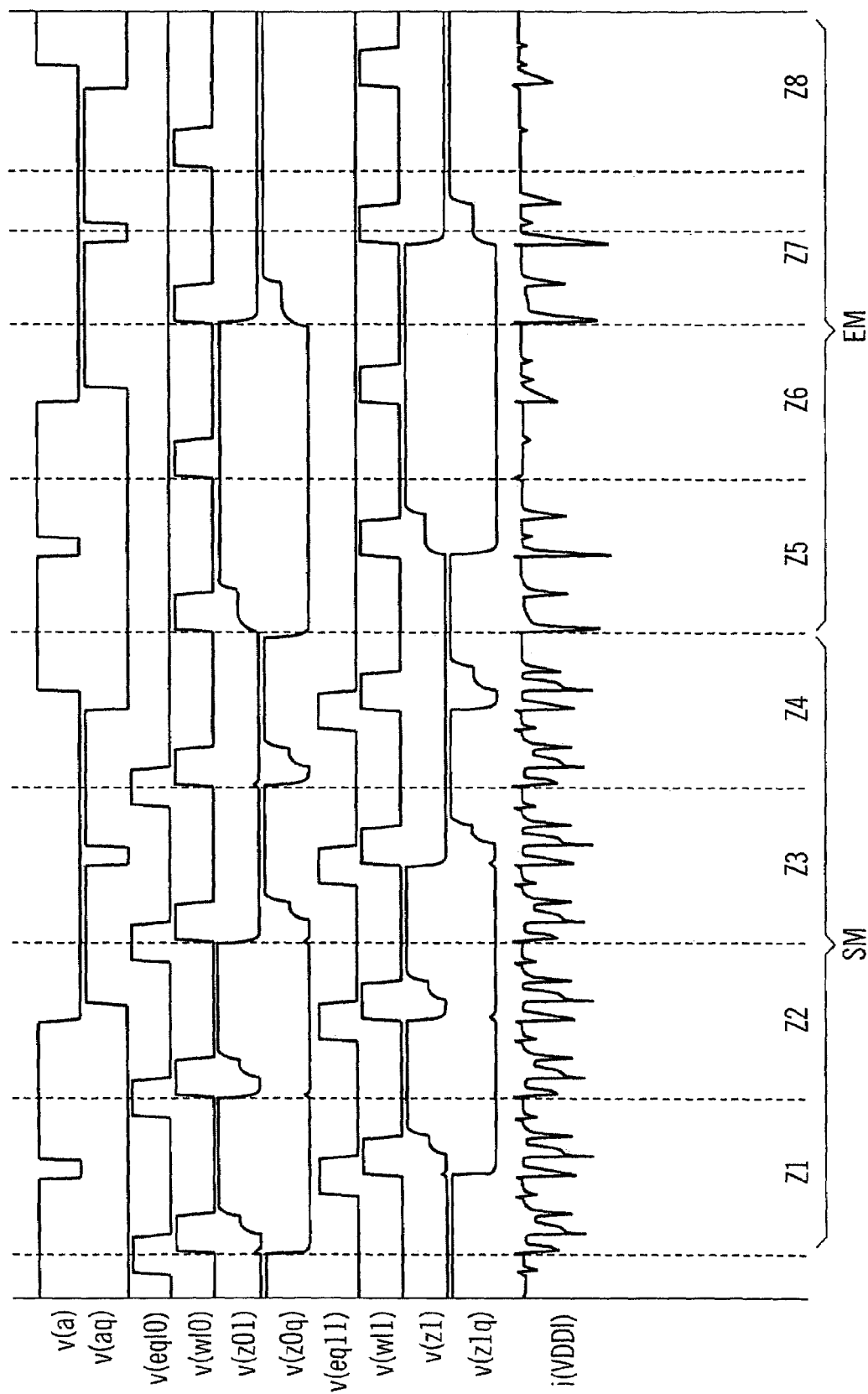
FIG. 6 shows a diagram illustrating time signal waveforms of signals in the circuit arrangement shown in FIG. 5.

FIG. 5 shows two series-connected latch arrangements, as illustrated in FIG. 4. FIG. 6 shows the time waveform of the control signals w10, eq10, w11 and eq11 generated by the control unit 26, of the data signals (a,aq), (z0,z0$q$) and (z1,z1$q$) as well as the profile of the current i(VDD) produced from the supply voltage VDD for the circuit shown in FIG. 5. In this case, the time axis is once again subdivided into eight cycles. As in the case of the diagram shown in FIG. 3 as well, the circuit operates in the security mode SM in the cycles Z1, Z2, Z3 and Z4, and in the power saving mode EM in the cycles Z5, Z6, Z7 and Z8. As can be seen from the curve for i(VDD), the current drawn in the cycles Z1 . . . Z4 is independent of the data being processed, while the current drawn depends on the data item in each case being processed in the power saving mode EM in the cycles Z5 . . . Z8. The power consumption in this case is about 50% less than in the security mode.

Figure 7:
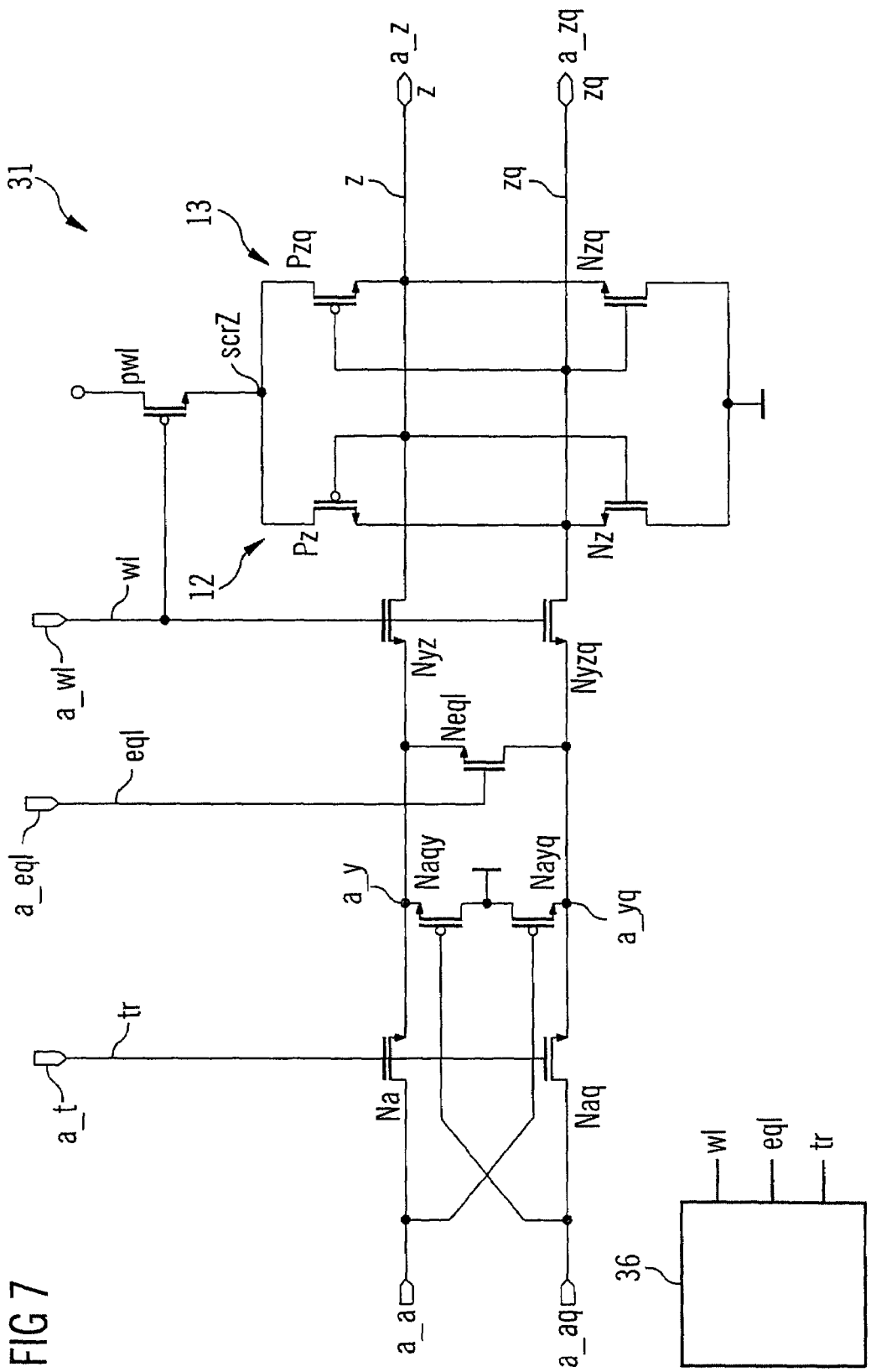
FIG. 7 shows a third exemplary embodiment of a circuit arrangement according to the invention using pass transistor logic.

FIG. 7 shows a third exemplary embodiment of a circuit arrangement according to the invention. This is once again a latch. With regard to the connection transistor Neq1, the transistors Nyz and Nyzq for activation of the process of writing a data item and the latch inverter, the circuit corresponds to the exemplary embodiment shown in FIG. 4. Two transfer transistors Na and Naq are provided instead of the input inverters 14 and 15 in the exemplary embodiment shown in FIG. 4, and are driven by an additional control signal tr. Two transistors Nayq and Naqy are arranged downstream from the transfer transistors in the data flow direction, and their load connections are connected firstly to the respective node a_y or a_yq and secondly to the reference ground potential. The gate connections of the transistors are connected in a cross-coupled manner to the data input nodes a_a and a_aq. A logic "1" is transferred through the transfer transistors Na and Naq from the data input connections a_a and a_aq to a_y and a_yq, respectively, provided that the transistors are switched on. Only the threshold voltage is dropped across the transfer transistors, so that the level of a logic "1" at the respective node a_y or a_yq is slightly less than that of the input nodes a_a and a_aq. The exemplary embodiment shown in FIG. 7 uses n-channel transistors, so that the transistors are switched on when the signal tr is "1".

The transfer transistors Na and Naq ensure decoupling between the nodes a_y, a_yq and the data input nodes a_a and a_aq. When it is intended to write valid data to the latch, the transistors Na and Naq are switched on. The connection transistor Neq1 is switched to a high resistance. As has been described with reference to FIGS. 1 and 4, the writing process can be carried out controlled by the signal w1.

In order to produce precharge phases, the signal eq1 is set to "1", so that the transistor Neq1 is switched on. In consequence, the nodes a_y and a_yq are connected, so that the potential is matched. Since a logic "1" is applied either to the input node a_a or to the input a_aq in accordance with the validity rules for dual rail signals, either the transistor Nayq or Naqy is switched on, so that either the node a_y or a_yq is connected to the reference ground potential. Since the other node a_yq or a_y is conductively connected by the connection transistor Neq1 to the node which is at the reference ground potential, the potential at the other node is also drawn to the reference ground potential. This invalid data item (0,0), which thus occurs at the complementary data nodes k and ky, is then written to the latch inverters 12 and 13 via the transistors Nyz and Nyzq, which are driven for this purpose when w1=1, so that a precharge phase (0,0) is outputted at the output.

The described production of a precharge phase takes place only when the potential at the nodes a_y and a_yq is independent of the potential of the input nodes a_a and a_aq. This therefore ensures that the transistors Na and Naq are switched off while the control signal tr is producing a precharge phase.

The signal tr is required as an additional control signal for the decoupling (as provided by the circuit arrangement in FIG. 7) of the nodes a_y and a_yq from the data input nodes a_a and a_aq. However, this is relatively uncritical for one specific configuration of a semiconductor circuit, since the control line can be routed parallel to the control line for the signal eq1. A circuit arrangement designed in this way has the advantageous feature that, apart from two transistors in the latch inverters 12 and 13, no p-channel transistors need be used, so that the area requirement is reduced.

Figure 8:
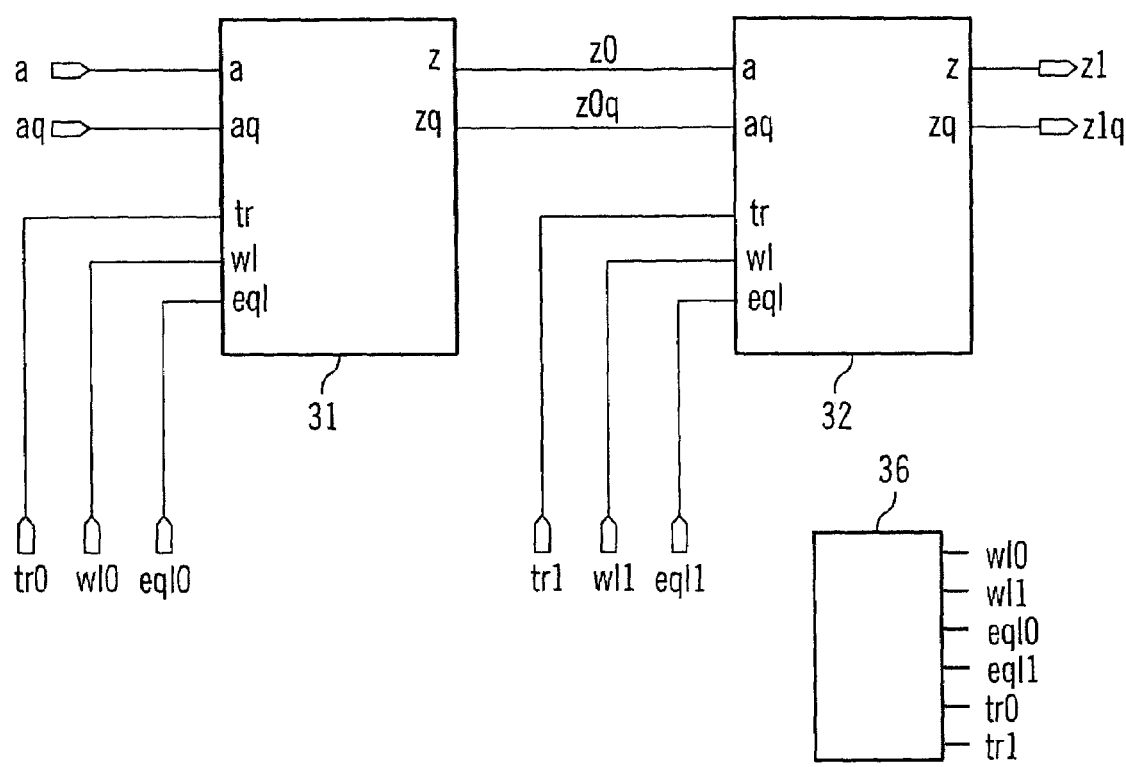
FIG. 8 shows an arrangement of two circuit arrangements as shown in FIG. 7.
Figure 9:
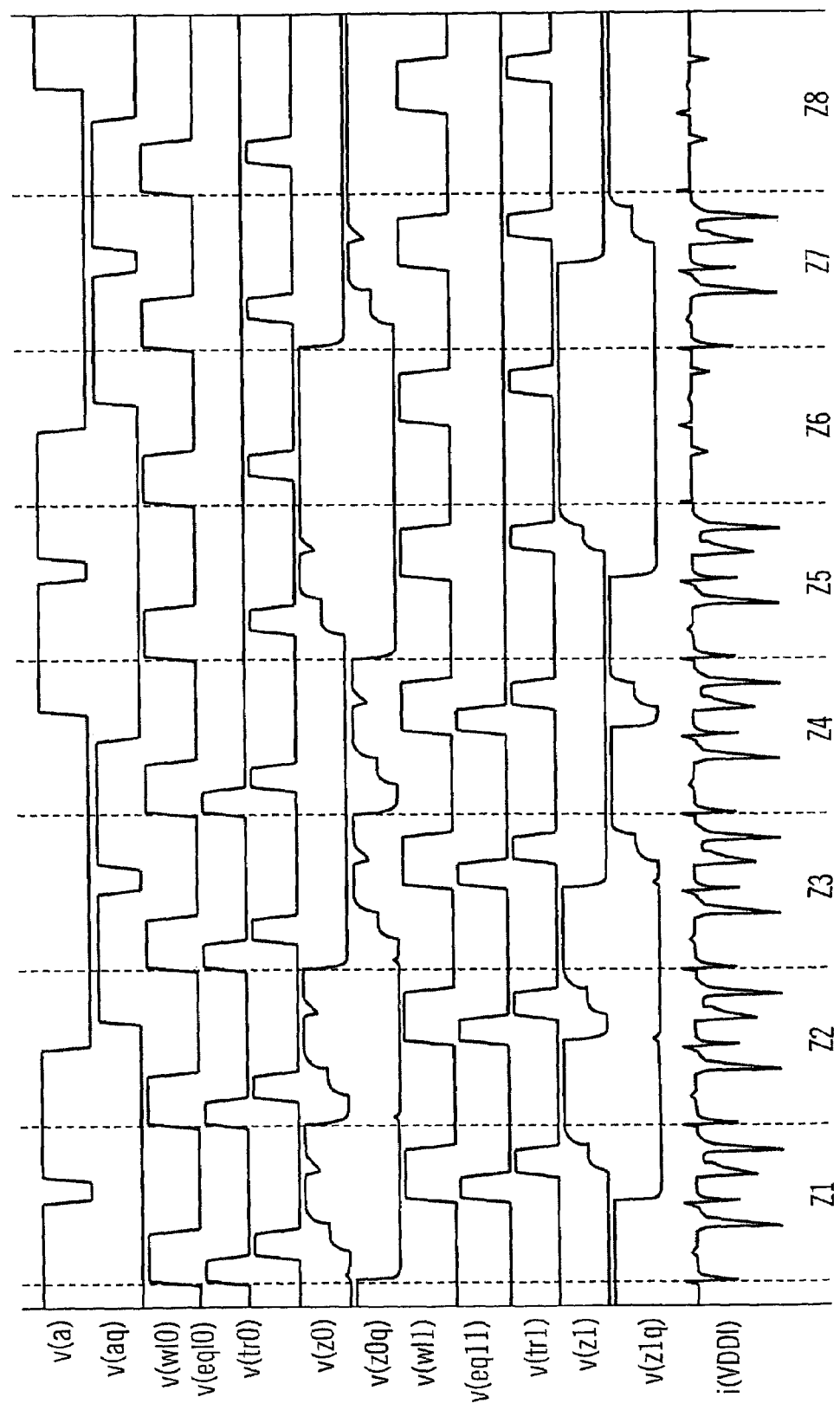
FIG. 9 shows a diagram illustrating time signal waveforms of signals in the circuit arrangement shown in FIG. 8.

FIG. 8 shows two series-connected latch circuits, as are shown in FIG. 7. FIG. 9 shows the time waveform of the control signals w10, eq10, tr0, w11, eq11 and tr1, of the data signal (a,aq), (z0,z0q) and (z1,z1q), as well as the profile of the current i(VDD) produced from VDD for the circuit shown in FIG. 5. As can also be seen from the signal profiles shown in FIG. 3 and FIG. 6, the current drawn in the cycles Z1 . . . Z4 is independent of the data item in each case being processed, while the current drawn during the cycles Z5 . . . Z8 depends on the data being processed. By suitable control of the connection transistor that is provided according to the invention, as has been described above, it is thus also possible in the case of the circuit shown in FIG. 7 to select either a power saving mode or a security mode.

Figure 10:
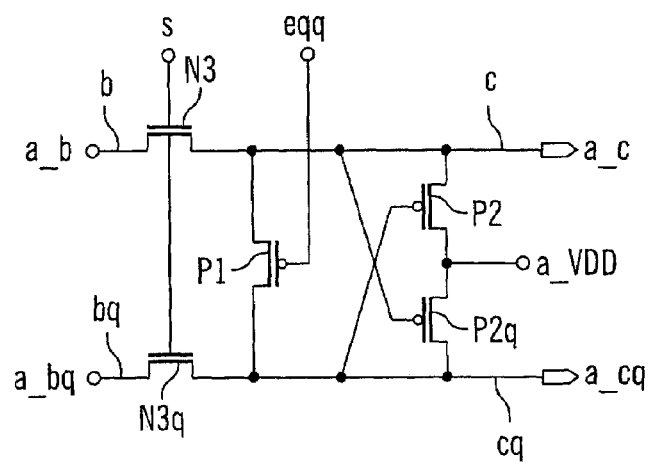
FIG. 10 shows an exemplary embodiment of a means for generating a potential balance state in a precharge phase.

FIG. 10 shows a circuit arrangement which forms means for producing a potential balance state. These means have complementary data input nodes a_b and a_bq for reception of a dual rail input signal (b, bq), as well as complementary data output nodes a_c and a_cq for outputting a dual rail output signal (c, cq).

The data output nodes a_c and a_cq can be connected to one another by means of a connection transistor P1. This transistor is a p-channel transistor, which can be driven by a control signal eqq. When the control signal eqq is "0", the transistor P1 has a low resistance, so that the nodes a_c and a_cq are also connected to one another with a low resistance. When the control signal eqq is "1", the transistor P1 is switched off, and the nodes a_c and a_cq are disconnected. In addition, transistors P2 and P2q are provided, whose load connections are respectively connected between one of the data output nodes a_c and a_cq as well as a supply voltage connection a_VDD, which is at an upper supply voltage potential VDD. Both of these transistors are likewise p-channel transistors. The gate connection of the transistor P2, which is connected between the data output nodes a_c and a_VDD, is connected to the drain connection of the other transistor P2q, which is at the same time connected to the second data output node a_cq. The gate connection of the transistor P2q is in contrast connected to the drain connection of the transistor P2 and to the data output node a_c. This results in cross-coupling, whose method of operation will be explained in the following text. Two pass gate transistors are connected between the data input nodes a_b and a_bq and the connection transistor P1, in order to make it possible to disconnect the data input nodes from the rest of the circuit. These are n-channel transistors N3 and N3q, which are driven by a control signal s.

First of all, it is assumed that the transistors N3 and N3q have been switched to have a low resistance. Because of the voltage drop across the pass gate transistors N3 and N3q, the potential on the output side is actually lower than that at the nodes a_b and a_bq on the input side. However, the cross-coupled transistors P2 and P2q raise the potential to the supply voltage potential VDD, although, of course, this applies only to the node which is at a high signal level. This is because the other data input node is at a low signal level. For the purposes of the explanation, it is assumed that the data input node a_b is at the high signal level, and that the node a_bq is at the low signal level. The gate of the transistor P2 is thus driven by a low signal level, so that the transistor P2 has a low resistance. In consequence, the connection between VDD and the data output node a_c has a low resistance, leading to the potential at the node a_c being raised. On the other hand, a high signal level is applied to the gate connection of the transistor P2q, so that the transistor P2q has a high resistance, and thus has no influence on the potentials at the data output nodes.

In order to produce a potential balance state, the data input nodes a_b and a_bq are disconnected from the data output nodes a_c and a_cq by switching the transistors N3 and N3q to have a high resistance. The signal eqq then results in the connection transistor P1 being switched to have a low resistance, so that the data output nodes a_c and a_cq are conductively connected to one another with a low resistance. After a transitional phase, the nodes a_c and a_cq thus assume the same potential. The disconnection of the node a_c from the node a_q results in the node a_cq no longer being drawn to the reference ground potential corresponding to a low signal level. The potential at the node a_cq rises as a result of the low-resistance connection via the transistor P1. In consequence, the resistance of the transistor P2 increases, so that the potential at the node a_c falls. At the same time, the potential at the node a_cq rises further, since charge equalization between the nodes a_c and a_cq takes place via the transistor P1. First of all, a current can still flow via the transistor P2, and lead to a potential at the nodes a_c and a_cq not being set in the center between the previous potentials at the nodes a_c and a_cq but, in the steady state, reaching a value which, although it is above the mean value of the potentials at a_c and a_cq, is less than the supply voltage potential VDD. This is because, on reaching the voltage VDD minus the threshold value VTP of the transistor P2, this transistor P2 is switched off completely, so that it is no longer possible for any current to flow from VDD to a_c. The transistor P2q plays no role in this process, since it is not switched on.

In a subsequent assessment case, the connection between a_c and a_cq is disconnected again, by switching the connection transistor P1 to have a high resistance. Furthermore, the transistors N3 and N3q are switched on. If it is assumed that the data input node a_bq is still at the low signal level, then the transistor P2 is switched on again, and the node a_c is raised to the potential VDD.

In the situation where the node a_b is at the low signal level, the node a_c is in consequence drawn to the low signal level, and this leads to the transistor P2q being switched on, and thus connecting the node a_cq to a_VDD.

Figure 11:
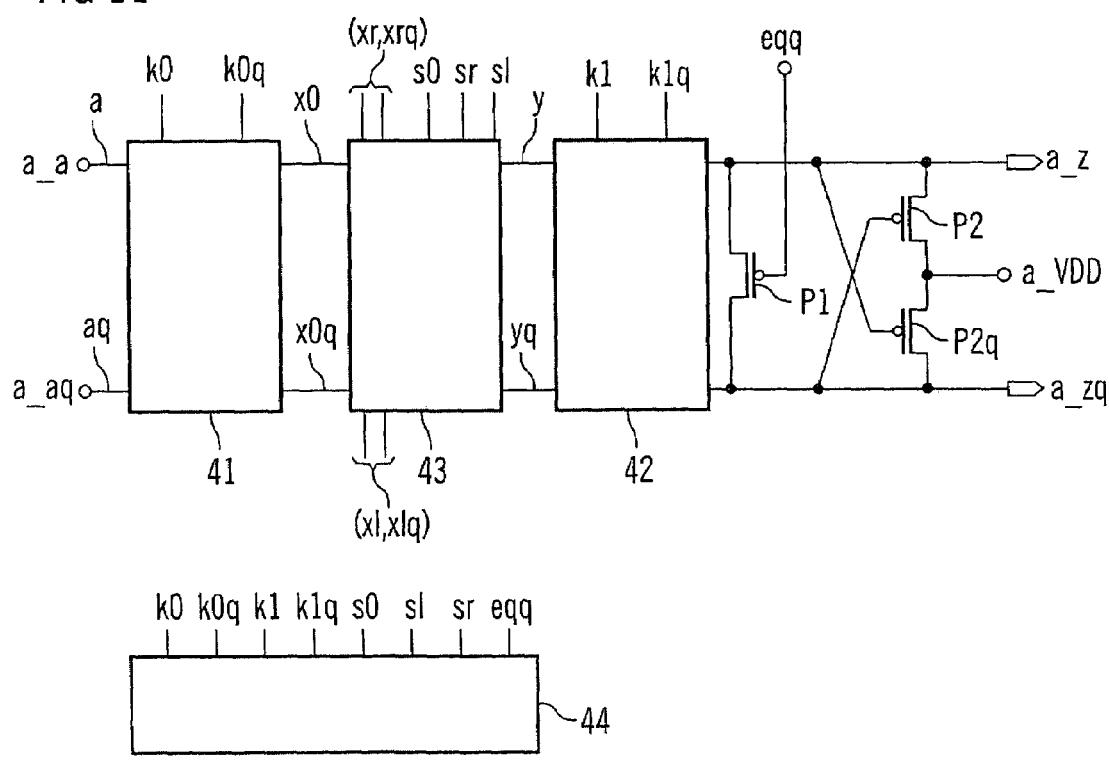
FIG. 11 shows an exemplary embodiment of a circuit arrangement according to the invention with dual rail control signals, and a means for generating a potential balance state.

FIG. 11 shows an exemplary extended embodiment of a circuit arrangement according to the invention. An arrangement comprising a first signal processing unit 41, a multiplexer 43 and a second signal processing unit 42 is connected upstream of the arrangement comprising the transistors P1, P2 and P2q. The first signal processing unit 41 carries out initial processing of a data input signal. In the illustrated exemplary embodiment, this comprises a logic operation with a dual rail signal (k0, k0q), which is referred to in the following text as a control signal. However, this could just as well be regarded as a data signal, since data to be processed can also be used for drive purposes. An intermediate signal (x0, x0q) is outputted at the outputs of the first signal processing unit 41.

The multiplexer 43 is arranged next, and is also supplied with further intermediate signals (xr, xrq) and (x1, x1q). The selection signal s0, s1, sr is used to choose which of the dual rail data signals applied to the inputs of the multiplexer 43 will be passed on at the output. One of the signals (x0, x0q), (xr, xrq) or (x1, x1q) is thus available as the further intermediate signal (y, yq). The multiplexer 43 is followed by a further signal processing unit 42, which has further inputs for a signal (k1, k1q), which is logically linked with the signal (y, yq). The signal which is outputted at the output of the second signal processing unit 42 is now produced at the data output nodes z and zq. The connection transistor P1 and the cross-coupled transistors P2 and P2q are also provided between the outputs of the second signal processing unit 42 and the data output nodes in order, as described above, to produce a potential balance state and in order to refresh the signal.

As can be seen from FIG. 11, many of the signals are dual rail signals. This relates not only to the actual data signals (a, aq), (xr, xrq), (x1, x1q), but also to the control signals/data signals (k0, k0q) and (k1, k1q). As has already been stated in the introduction, in the case of dual rail signal processing and subject to the precondition of physical equivalent between two nodes k and kq, it is no longer possible to tell by means of differential current profile analysis whether a "1" or a "0" has been transmitted as the data item. However, this is completely true only when a signal change takes place for every transmitted data item, that is to say the information "1" and the information "0" alternate. If a plurality of identical data items are transmitted successively, the characteristics in terms of the capability to carry out attacks by means of differential current profile analysis deteriorate.

In the case of circuit arrangement for processing dual rail signals, the security can be improved by also equipping the dual rail control signals with a so-called precharge phase.

In the exemplary embodiment shown in FIG. 11, an invalid signal state can be produced between two data items to be transmitted, by the dual rail signal assuming the state (0,0) or (1,1). This applies both to the control signals and to the data signals. The control signals are produced by a control unit 44, which allows flexible generation of control signals depending on the intended result. In this exemplary embodiment of the invention, this is made use of to operate also this part of the circuit arrangement in different operating modes. All of the dual rail signals are produced and processed with precharge in a security mode. Externally, this results in a current profile which is independent of the nature of the data to be processed, even when the same data items are transmitted sequentially.

As stated above, one disadvantage of operation in the security mode is that a relatively large amount of power is consumed. It is therefore advantageous to operate this part of the circuit in a power saving mode as well, when no security-critical data need be processed. The dual rail signals are processed without any precharge in this power saving mode. There is therefore no need to completely discharge or completely charge a node, even though this is not necessary on the basis of the values of the data to be transmitted. Nevertheless, the potential balance states, as have been described above, can be used both in the data path and in the control signal paths.

Figure 12:
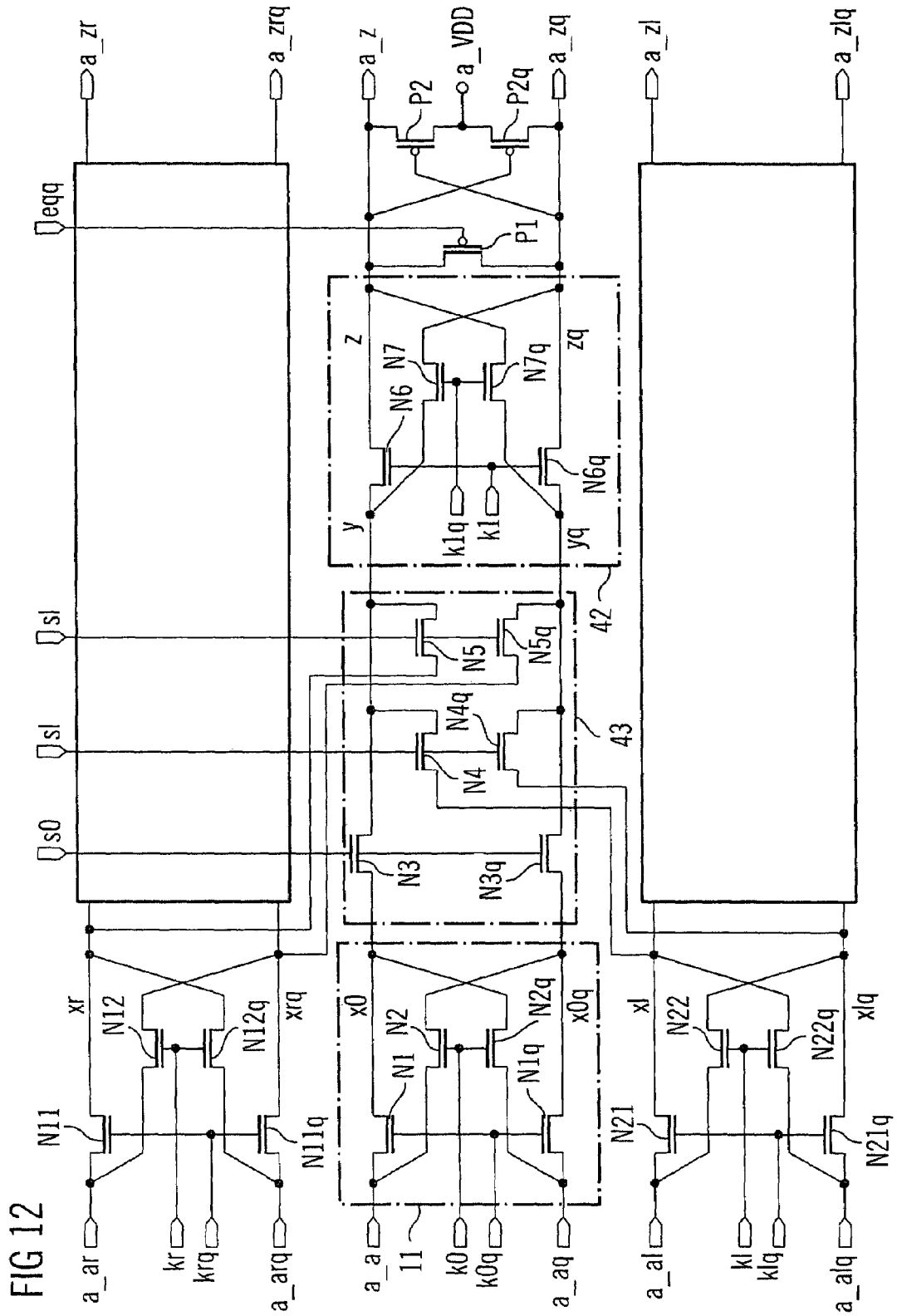
FIG. 12 shows an extended, more detailed illustration of the circuit arrangement shown in FIG. 11.

FIG. 12 shows a more detailed illustration of the exemplary embodiment shown in FIG. 11, with the control unit 44 having been omitted, for the sake of clarity. It is, of course, present and is also designed to generate the further control signals which are referred to above and are shown in FIG. 12. As can be seen from FIG. 12, the first signal processing unit 41 is an XOR gate, which is formed in a known manner by means of transistors N1, N1q, N2 and N2q. The second signal processing unit 42 is likewise an XOR gate, which is formed from transistors N6, N6q, N7 and N7q. The multiplexer 43 is formed from six transistors using pass gate logic, with one of the transistor pairs, specifically comprising the transistors N3 and N3q, being provided for inputting the data (x0, x0q) from the first signal processing unit 41. The further transistor pairs with the transistors (N4, N4q) and (N5, N5q) are used for inputting data signals from adjacent circuit paths. The circuit shown in FIG. 12 comprises data path segments using so-called "bit slice" pass transistor logic. The expression pass transistor logic is usually used synonymously to the expression pass gate logic. Bit slice technology refers to a circuit configuration in which all of the circuit parts are arranged on one "track" in order to process one bit, with the tracks being arranged in parallel with one another, in order to process a plurality of bits. The control signals are carried transversely with respect to this. This technique allows a systematic and clear design, which nevertheless saves space, for a circuit arrangement. Furthermore, this ensures that all of the bits are processed subject to the same constraints, which is advantageous with regard to the current profile considerations as have been described above.

Data signals (xr, xrq) and (x1, x1q) of the adjacent bit slices are thus input by means of the multiplexer 43 and, specifically, this may be a carry. The multiplexer is driven by three control signals s0, s1 and sr, in which case each of the control signals is responsible for selection of one data input signal. The adjacent bit slices are supplied with data signals (ar, arq) and (a1, a1q) and are XOR linked with control signals (kr, krq) and (k1, k1q).

Figure 13:
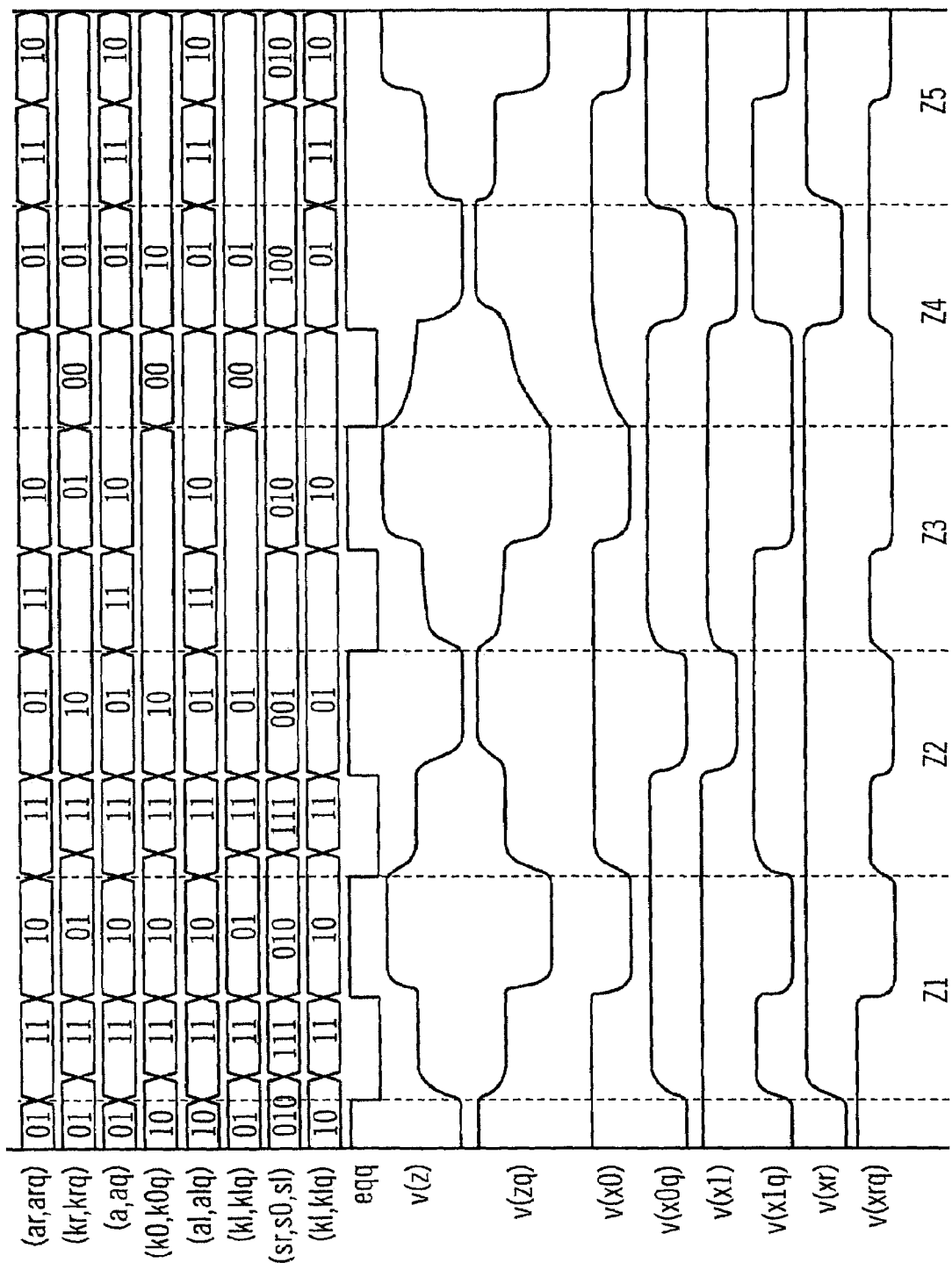
FIG. 13 shows a signal diagram with the time waveform of signals in the circuit arrangement shown in FIG. 12.

The operating behavior of the circuit shown in FIG. 12 is illustrated in the diagram in FIG. 13. The time waveform is in this case subdivided into five phases Z1 ... Z5. The circuit is operated in the security mode in the phases Z1 and Z2. All of the data and control signals are in a precharge phase, as can be seen in the first half of the phase Z1. The control signal eqq is at the low signal level, so that the transistor P1 has a low resistance and connects the data output nodes z and zq with low resistance. In the illustrated detail of the circuit arrangement, the data output nodes z and zq are admittedly not disconnected from the input nodes a and aq but, because of the chain of n-channel transistors N1, N3, N6 and N1q, N3q and N6q, the voltage drop between the potentials at the respective inputs a and aq and the respective outputs z and zq is sufficiently great that the potential at the data output nodes z and zq would be below the upper potentials even without the potentials being fixed by the transistors P2 and P2q, and these upper potentials are governed by the transistors P2 and P2q.

In the subsequent assessment phase, valid dual rail signals (a, aq), (ar, arq) and (a1, a1q) are applied to the input side during the time period Z1. The control signals (k0, k0q), (kr, kr), (k1, k1q), sr, s0, s1 are also valid. A signal (z, zq)=(1,0) is outputted at the outputs, in accordance with the circuit logic. The potentials at the nodes z and zq are in this case drawn to VDD and the reference ground potential, respectively, by the transistors P2 and P2q, in the manner described above. This results in the signals being refreshed with clean signal levels. Data processing in the security mode likewise takes place in the time period Z2, as can be seen on the basis of the precharge phases in the first half of the time period. Different control signals (kr, krq), (k1, k1q) and sr, s0, s1 are processed from those that are processed in the time period Z1.

After the end of the time period Z2, the circuit is switched to the power saving mode, thus indicating that the dual rail signals do not all have an inserted precharge phase at the start of the time period Z3. Only the data signals (ar, arq), (a, aq) and (a1, a1q) have a precharge phase, thus indicating that dual rail signals with precharge can still be processed in the power saving mode. In the same way as in the security mode, potential balance states are set at the output nodes z and zq. The data signals have no precharge phase in the time period Z4, but a precharge phase is provided for the control signals (kr, krq), (k0, k0q) and (k1, k1q). This indicates that dual rail signals without any precharge can also be processed with control signals which have a precharge phase. The potential balance state is produced in the same way as in the time period Z3 by actuating transistor P1 such that its resistance is low.

As can be seen from the signal waveforms in the time period Z5, a potential balance state can be produced even without using the transistor P1. The control signal eqq for the transistor P1 remains at the high signal level, so that the transistor P1 has a high resistance. However, the control signal (k1, k1q)=(1,1), as a result of which the transistors N6 and N6q as well as N7 and N7q are switched to a low resistance. A low-resistance connection is provided between the data output nodes z and zq via the transistors N6 and N7 and N6q and N7q so that the potential balance can be set between the nodes z and zq. If the control unit 44 ensures that a low-resistance connection is established between the data output nodes z and zq via the second signal processing unit 42, the transistor P1 can be omitted from the circuit arrangement.

Alternative refinements of circuit arrangements according to the invention will, of course, be evident to those skilled in the art, so that the invention is not restricted to the described specific exemplary embodiments. In particular, the functions of the signal processing units 41 and 42 can be varied freely. As has been shown, it is also possible for the connection of the nodes z and zq not to be restricted to a p-channel connection transistor P1. In general, the use of transistors of a different type is within the scope of those skilled in the art.

Further refinements of circuit arrangements according to the invention are within the scope of the knowledge of those skilled in the art, and are covered by the claims.

What is claimed is:

1. A circuit arrangement comprising:
    complementary data input nodes for reception of a dual rail data signal; and
    complementary data output nodes for outputting a dual rail data signal,
    wherein a connection switch is connected to complementary data nodes by means of which the complementary data nodes can be connected to one another with a low resistance,
    wherein a control unit is provided for generating a first control signal for the connection switch, and
    wherein the circuit arrangement is designed to be operated in a power saving mode, in which the connection switch is switched by the control unit to have a high resistance, and in a security node, in which the connection switch is switched by the control unit to have a low resistance when the potential at the complementary data nodes is intended to be equalized.

2. The circuit arrangement as claimed in claim 1, wherein the complementary data nodes to which the connection switch is connected are arranged on the output side in the data flow direction.

3. The circuit arrangement as claimed in claim 1, wherein the complementary data nodes to which the connection switch is connected are arranged on the input side in the data flow direction.

4. The circuit arrangement as claimed in claim 1, wherein the circuit arrangement has a memory element.

5. The circuit arrangement as claimed in claim 4, wherein the memory element has two memory inverters, which are followed by two output inverters for decoupling the memory element from the data outputs.

6. The circuit arrangement as claimed in claim 5, wherein the connection switch is connected downstream from the output inverters.

7. The circuit arrangement as claimed in claim 5, wherein pass gate transistors are arranged upstream of the memory element in the data flow direction and are driven by a second control signal which is produced by the control unit, in order to disconnect data inputs of the memory element from data inputs of the circuit arrangement.

8. The circuit arrangement as claimed in claim 5, wherein those connections of the output inverters which are on the supply voltage side are connected to an isolating transistor which is driven by the first control signal in order to disconnect the output inverters from a node which carries the supply voltage.

9. The circuit arrangement as claimed in claim 4, wherein the memory element has two memory inverters, which are preceded by two input inverters for decoupling the memory element from the data inputs.

10. The circuit arrangement as claimed in claim 9, wherein the connection switch is connected downstream from the input inverters.

11. The circuit arrangement as claimed in claim 9, wherein pass gate transistors are arranged upstream of the memory element in the data flow direction and are driven by a second control signal, which is generated by the control unit, in order to disconnect data inputs of the memory element from data outputs of the input inverters.

12. The circuit arrangement as claimed in claim 9, wherein those connections of the input inverters which are on the supply voltage side are connected to an isolating transistor which is driven by the first control signal in order to disconnect the input inverters from a node which carries a supply voltage.

13. The circuit arrangement as claimed in claim 4, wherein the memory element has two memory inverters, which are preceded by a decoupling circuit, with the decoupling circuit comprising:
  a first and a second pass gate transistor, which are driven by a second control signal, in order to disconnect the data inputs of the memory element from the complementary data nodes;
  a third and a fourth pass gate transistor, which are arranged upstream of the first and the second pass gate transistor in the data flow direction and are driven by a third control signal, in order to disconnect the complementary data nodes from data inputs of the circuit arrangement which are associated with them; and
  two transistors by means of which the two complementary data nodes can each be connected to a reference ground potential node, with the gate connections being connected to the respective data input nodes which are associated with the other of the complementary data nodes.

14. A circuit arrangement comprising:
  complementary data input nodes for reception of a dual rail data signal;
  complementary data output nodes for outputting a dual rail data signal; and
  means for production of a potential balance state, in which the potentials at the complementary data output nodes are the same and are in an intermediate range between a high signal level and a low signal level,
  wherein a connection switch is connected to complementary data nodes by means of which the complementary data nodes can be connected to one another with a low resistance,
  wherein a control unit is provided for generating a first control signal for the connection switch, and
  wherein the circuit arrangement is designed to be operated in a power saving mode, in which the connection switch is switched by the control unit to have a high resistance, and in a security node, in which the connection switch is switched by the control unit to have a low resistance when the potential at the complementary data nodes is intended to be equalized.

15. The circuit arrangement as claimed in claim 14, wherein the upper limit of the intermediate range is at least one p-channel transistor threshold voltage below an upper supply voltage potential.

16. The circuit arrangement as claimed in claim 14, wherein the lower limit of the intermediate range is at least one n-channel transistor threshold voltage above a lower supply voltage potential.

17. The circuit arrangement as claimed in claim 16, wherein two cross-coupled p-channel transistors are provided, whose source connections are each connected to a supply voltage connection, whose drain connections are each connected to one of the complementary data output nodes, and whose gate connections are each connected to the drain connection of the other transistor.

18. The circuit arrangement as claimed in claim 14, wherein a pass gate transistor is in each case connected between the complementary data input nodes and the complementary data output nodes, in order to disconnect the complementary data input nodes.

19. The circuit arrangement as claimed in claim 18, wherein a first signal processing unit is connected between the complementary data input nodes and the pass gate transistors in order to process a dual rail signal which is applied to the data input node.

20. The circuit arrangement as claimed in claim 19, wherein a second signal processing unit is connected between the pass gate transistors and the complementary data output nodes.

21. The circuit arrangement as claimed in claim 18, wherein the pass gate transistors are part of a multiplexer, by means of which dual rail signals can be input from further pairs of complementary data input nodes.

22. The circuit arrangement as claimed in claim 17, wherein the connection transistor is switched to a high resistance in an assessment phase and, when the signal level at one of the complementary data output nodes is low, the other data output node is connected via the cross-coupled transistor which is connected to it to the supply voltage connection to which the upper supply voltage potential is applied.

23. The circuit arrangement as claimed in claim 19, wherein a control signal which is provided for driving the first signal processing unit is a dual rail signal.

24. The circuit arrangement as claimed in claim 20, wherein a control signal which is provided for driving the second signal processing unit, is a dual rail signal.

25. The circuit arrangement as claimed in claim 24, wherein the circuit arrangement is designed to be operated in various operating modes, with one operating mode being a power saving mode and another operating mode being a security mode, with a precharge phase being provided between two valid dual rail signal states in the control signal for driving the first signal processing unit in the security mode, in which precharge phase the dual rail signal assumes one of the invalid states.

26. The circuit arrangement as claimed in claim 24, wherein the circuit arrangement is designed to be operated in various operating modes, with one operating mode being a power saving mode and another operating mode being a security mode, with a precharge phase being provided between two valid dual rail signal states in the control signal for driving the second signal processing unit in the security mode, in which precharge phase the dual rail signal assumes one of the invalid states.

27. The circuit arrangement as claimed in claim 21, wherein a plurality of control signals are provided for driving the multiplexer, and the circuit arrangement is designed to be operated in various operating modes, with one operating mode being a power saving mode and another operating mode being a security mode, with invalid control signals, which are all at the same signal level, being used in the security mode for drive purposes between valid control signals.

28. The circuit arrangement as claimed in claim 25, wherein the precharge phases in the control signals for the first and second signal processing units and the control signals for the multiplexer are provided such that they overlap in time, and are preferably simultaneous.

29. The circuit arrangement as claimed in claim 28, wherein a control unit is provided in order to generate the control signals.

30. A method for operating a dual rail circuit arrangement, wherein the dual rail circuit arrangement can be operated alternatively in a security mode or in a power saving mode, with two complementary data nodes being connected during operation in the security mode when the potential at the complementary data nodes is intended to be equalized in the security mode.

31. The method as claimed in claim 30, wherein, while the connection between the complementary data nodes is in existence, any connection between the complementary data nodes and a supply voltage node is disconnected.

32. The method as claimed in claim 30, wherein a decoupling circuit is connected between the dual rail circuit arrangement and a further dual rail circuit arrangement, and is used to prevent any reaction on an upstream dual rail circuit arrangement.

33. The method as claimed in claim 32, wherein inverter circuits are used as the decoupling circuit.

* * * * *

UNITED STATES PATENT AND TRADEMARK OFFICE
CERTIFICATE OF CORRECTION

PATENT NO. : 7,248,506 B2  Page 1 of 1
APPLICATION NO. : 11/264703
DATED : July 24, 2007
INVENTOR(S) : Thomas Kunemund It is certified that error appears in the above-identified patent and that said Letters Patent is hereby corrected as shown below:

In the Specification:

At column 4, line 11, "invenction" should read --invention--

At column 8, line 52, "this necessary" should read --this is necessary--

Signed and Sealed this

Sixteenth Day of October, 2007

JON W. DUDAS
*Director of the United States Patent and Trademark Office*

UNITED STATES PATENT AND TRADEMARK OFFICE
CERTIFICATE OF CORRECTION

PATENT NO. : 7,248,506 B2 Page 1 of 1
APPLICATION NO. : 11/264703
DATED : July 24, 2007
INVENTOR(S) : Thomas Kunemund It is certified that error appears in the above-identified patent and that said Letters Patent is hereby corrected as shown below:

At column 4, line 11, "invenction" should read --invention--

At column 8, line 52, "this necessary" should read --this is necessary--

Signed and Sealed this

Twenty-third Day of October, 2007

JON W. DUDAS
*Director of the United States Patent and Trademark Office*